(12) United States Patent
Gilmore et al.

(10) Patent No.: US 9,868,820 B2
(45) Date of Patent: Jan. 16, 2018

(54) POLYARYLENE MATERIALS

(71) Applicants: Rohm and Haas Electronic Materials LLC, Marlborough, MA (US); Rohm and Haas Electronic Materials Korea Ltd., Chungcheongnam-do (KR)

(72) Inventors: Christopher D. Gilmore, Watertown, MA (US); Lujia Bu, Holden, MA (US); Peng-Wei Chuang, Natick, MA (US); Deyan Wang, Hudson, MA (US); Yerang Kang, Ansan (KR); Ping Ding, Acton, MA (US); Young Seok Kim, Shrewsbury, MA (US); Kathleen M. O'Connell, Cumberland, RI (US)

(73) Assignees: Rohm and Haas Electronic Materials LLC, Marlborough, MA (US); Rohm and Haas Electronic Materials Korea Ltd, Seoul (KR)

( * ) Notice: Subject to any disclaimer, the term of this patent is extended or adjusted under 35 U.S.C. 154(b) by 502 days.

(21) Appl. No.: 14/472,429

(22) Filed: Aug. 29, 2014

(65) Prior Publication Data

US 2016/0060393 A1 Mar. 3, 2016

(51) Int. Cl.
| | |
|---|---|
| *C08G 65/38* | (2006.01) |
| *C09D 171/00* | (2006.01) |
| *C08L 71/00* | (2006.01) |
| *C08G 61/10* | (2006.01) |
| *C08G 61/12* | (2006.01) |
| *C09D 165/02* | (2006.01) |
| *C08L 65/02* | (2006.01) |
| *H01L 23/532* | (2006.01) |
| *H01L 23/498* | (2006.01) |
| *H01B 3/30* | (2006.01) |
| *H01L 51/00* | (2006.01) |

(52) U.S. Cl.
CPC ............ *C08G 65/38* (2013.01); *C08G 61/10* (2013.01); *C08G 61/12* (2013.01); *C08L 65/02* (2013.01); *C08L 71/00* (2013.01); *C09D 165/02* (2013.01); *C09D 171/00* (2013.01); *H01B 3/307* (2013.01); *H01L 23/49894* (2013.01); *H01L 23/5329* (2013.01); *H01L 51/0035* (2013.01); *C08G 2261/135* (2013.01); *C08G 2261/1644* (2013.01); *C08G 2261/312* (2013.01); *C08G 2261/46* (2013.01); *C08G 2261/64* (2013.01); *C08G 2261/65* (2013.01); *C08G 2261/76* (2013.01); *H01L 2924/0002* (2013.01)

(58) Field of Classification Search
CPC ........ C08G 65/38; C08G 61/10; C08G 61/12; C08G 2261/135; C08G 2261/1644; C08G 2261/312; C08G 2261/46; C08G 2261/64; C08G 2261/65; C08L 65/02; C08L 71/00; C09D 165/02; C09D 171/00; H01B 3/307; H01L 23/49894; H01L 23/5329; H01L 51/0035
USPC ............................................... 427/385, 385.5
See application file for complete search history.

(56) References Cited

U.S. PATENT DOCUMENTS

| | | | |
|---|---|---|---|
| 5,965,679 A * | 10/1999 | Godschalx | ............ C08G 61/10 526/281 |
| 6,288,188 B1 | 9/2001 | Godschalx et al. | |
| 6,630,520 B1 | 10/2003 | Bruza et al. | |
| 6,646,081 B2 | 11/2003 | Godschalx et al. | |
| 7,635,741 B2 | 12/2009 | Niu et al. | |
| 8,110,636 B1 | 2/2012 | Fujimoto et al. | |
| 2003/0083392 A1* | 5/2003 | Bruza | ........................ C08J 9/26 521/77 |
| 2003/0165625 A1 | 9/2003 | So et al. | |

FOREIGN PATENT DOCUMENTS

| | | | |
|---|---|---|---|
| CN | 102386336 A | 3/2012 | |
| JP | 2001-348422 A | 12/2001 | |
| JP | 2001348422 | * 12/2001 | ............ C08G 61/02 |
| JP | 2010-070618 A | 4/2010 | |
| WO | 9318076 A1 | 9/1993 | |
| WO | 9710193 | 3/1997 | |
| WO | 2004073824 A2 | 9/2004 | |

OTHER PUBLICATIONS

Search report for corresponding European Application No. 15 17 9985.
Kumar, et al, "Diels-alder polymerization between bis(cyclopentadienones) and acetylenes. A versatilce route to new highly aromatic polymers", Macromolecules, vol. 28, No. 1, pp. 124-130.
Search report for corresponding China Application No. 201510522680.8 dated Feb. 7, 2017.
Stille, et al, "The cross-linking of thermally stable aromatic polymers by aryl cyanate cyclotrimerization", Macromolecules, May-Jun. 1976, pp. 516-523, vol. 9, No. 3.

\* cited by examiner

*Primary Examiner* — Ling Choi
*Assistant Examiner* — Chun-Cheng Wang
(74) *Attorney, Agent, or Firm* — S. Matthew Cairns

(57) ABSTRACT

Certain polyarylene oligomers having improved solubility are useful in forming dielectric material layers in electronics applications.

10 Claims, No Drawings

POLYARYLENE MATERIALS

The present invention relates generally to the field of polyarylene materials and more particularly to polyarylene oligomers for use in electronics applications.

Polymer dielectrics may be used as insulating layers in various electronic devices, such as integrated circuits, multichip modules, laminated circuit boards, displays and the like. The electronics fabrication industry has different requirements for dielectric materials, such as dielectric constant, coefficient of thermal expansion, modulus, and the like, depending upon the particular application.

Various inorganic materials, such as silica, silicon nitride and alumina, have been used as dielectric materials in electronic devices. These inorganic materials generally can be deposited in thin layers, typically by vapor deposition techniques, and have advantageous properties, such as not readily absorbing water. Polymer dielectric materials often possess properties which offer advantages over inorganic dielectric materials in certain applications, such as ease of application such as by spin-coating techniques, gap-filling ability, lower dielectric constants, and the ability to withstand certain stresses without fracturing, that is, polymer dielectrics can be less brittle than inorganic dielectric materials. However, polymer dielectrics often present challenges to process integration during fabrication. For example, to replace silicon dioxide as a dielectric in certain applications such as integrated circuits, the polymer dielectric must be able to withstand processing temperatures during metallization and annealing steps of the process. In general, the polymer dielectric material should have a glass transition temperature greater than the processing temperature of subsequent manufacturing steps. Also, the polymer dielectric should not absorb water which may cause an increase in the dielectric constant and potential corrosion of metal conductors.

Polyarylene polymers are well-known as dielectric materials and possess many desirable properties. For example, U.S. Pat. No. 5,965,679 discloses certain polyarylene oligomers prepared from a biscyclopentadienone monomer, an aromatic monomer containing three or more ethynyl moieties, and optionally an aromatic monomer containing two ethynyl moieties. U.S. provisional patent application Ser. No. 61/908,720 discloses polyarylene polymers prepared from certain ratios of a biscyclopentadienone monomer and certain aromatic monomers containing two ethynyl moieties. Polyarylene polymers are prepared at relatively high temperatures in organic solvents having relatively high boiling points (typically ≥150° C.). However, such reaction solvents are poor choices as casting solvents in the electronics industry, and the polyarylene polymers must be precipitated from the reaction solvent and taken up in a different organic solvent with a much lower boiling point that is suitable for casting films of these polymers. Such polyarylene polymers, particularly those prepared from certain di-ethynyl aromatic monomers, suffer from limited solubility in organic solvents conventionally used in the electronics industry, limiting the use of these polymers. There is a need in the industry for polyarylene polymers having improved solubility in organic solvents, particularly in organic solvents used to cast polymer films in the electronics industry.

The present invention provides an oligomer comprising as polymerized units a first monomer comprising two cyclopentadienone moieties, a second monomer having the formula (1), and a third monomer having the formula (2)

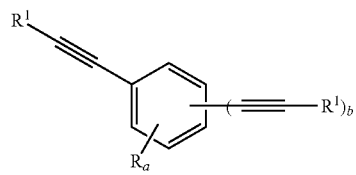

(1)

(2)

wherein a is the number of R groups and is an integer from 0 to 4; b is 1 or 2; each R is independently chosen from $C_{1-4}$ alkyl, halo $C_{1-4}$ alkyl, $C_{1-4}$ alkoxy, $C_{1-4}$ aralkyl, and optionally substituted $C_{6-10}$ aryl; each $R^1$ is independently H or optionally substituted $C_{6-10}$ aryl; $R^2$ is H, optionally substituted $C_{1-10}$ alkyl, optionally substituted $C_{7-12}$ aralkyl, optionally substituted $C_{6-10}$ aryl, or $R^3$; and $R^3$ is a polar moiety. The present polyarylene oligomers have improved solubility in common solvents used in the electronics industry, as compared to conventional polyarylene oligomers.

Also provided by the present invention is a composition comprising the oligomer described above and an organic solvent.

Further, the present invention provides a method of forming a dielectric material layer comprising: disposing a layer of the composition described above on a substrate surface; removing the organic solvent; and curing the oligomer to form a dielectric material layer.

As used throughout this specification, the following abbreviations shall have the following meanings, unless the context clearly indicates otherwise: ° C.=degree Celsius; g=gram; mg=milligram; L=liter; Å=angstrom; nm=nanometer; μm=micron=micrometer; mm=millimeter; sec.=second; min=minute; hr.=hour; DI=deionized; and mL=milliliter. All amounts are percent by weight ("wt %") and all ratios are molar ratios, unless otherwise noted. All numerical ranges are inclusive and combinable in any order, except where it is clear that such numerical ranges are constrained to add up to 100%.

The articles "a", "an" and "the" refer to the singular and the plural. "Alkyl" refers to linear, branched and cyclic alkyl unless otherwise specified. The term "oligomer" refers to dimers, trimers, tetramers and other polymeric materials that are capable of further curing. By the term "curing" is meant any process, such as polymerization or condensation, that increases the overall molecular weight of the present oligomers or removes polar moieties from the present oligomers. "Curable" refers to any material capable of being cured under certain conditions. When an element is referred to as being "disposed on" another element, it can be directly on the other element or intervening elements may be present therebetween. In contrast, when an element is referred to as being "disposed directly on" another element, there are no intervening elements present.

Oligomers of the present invention comprise as polymerized units a first monomer comprising two cyclopentadienone moieties, a second monomer having the formula (1), and a third monomer having the formula (2)

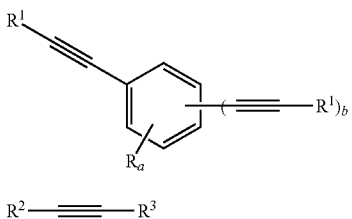

(1)

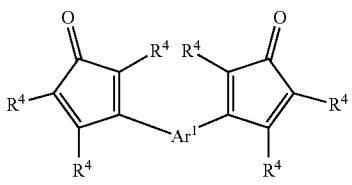

(2)

wherein a is the number of R groups and is an integer from 0 to 4; b is 1 or 2; each R is independently chosen from $C_{1-4}$ alkyl, halo $C_{1-4}$ alkyl, $C_{1-4}$ alkoxy, optionally substituted $C_{7-14}$ aralkyl, and optionally substituted $C_{6-10}$ aryl; each $R^1$ is independently H or optionally substituted $C_{6-10}$ aryl; $R^2$ is H, optionally substituted $C_{6-10}$ aryl, or $R^3$; and $R^3$ is a polar moiety. "Aryl" refers to aromatic carbocycles and aromatic heterocycles. It is preferred that aryl moieties are aromatic carbocycles. By "substituted aralkyl" or "substituted aryl" it is meant an aralkyl or aryl moiety, respectively, having one or more of its hydrogens replaced with one or more substituents chosen from halogen, $C_{1-6}$ alkyl, halo $C_{1-6}$ alkyl, $C_{1-6}$ alkoxy, halo $C_{1-6}$ alkoxy, phenyl, and phenoxy, and preferably from halogen, $C_{1-4}$ alkyl, halo $C_{1-4}$ alkyl, $C_{1-4}$ alkoxy, halo $C_{1-4}$ alkoxy, and phenyl. It is preferred that when R is an aralkyl, it is an unsubstituted aralkyl. It is preferred that substituted aryl is an aryl moiety having one or more of its hydrogens replaced with one or more substituents chosen from halogen, $C_{1-6}$ alkyl, $C_{1-6}$ alkoxy, phenyl, and phenoxy. Preferably, a substituted aryl has from 1 to 3 substituents, and preferably 1 or 2 substituents. More preferably, an unsubstituted aryl is used.

Any monomer containing two cyclopentadienone moieties may suitably be used as the first monomer to prepare the present oligomers. Alternatively, a mixture of different monomers, each having two cyclopentadienone moieties, may be used as the first monomer. Such monomers containing two cyclopentadienone moieties are well-known in the art, such as those described in U.S. Pat. Nos. 5,965,679; 6,288,188; and 6,646,081; and in Int. Pat. Pubs. WO 97/10193 and WO 2004/073824. It is preferred that the first monomer has the structure shown in formula (3)

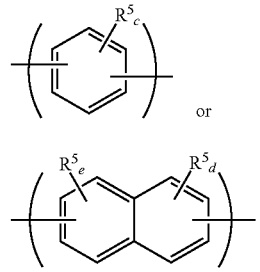

(3)

wherein each $R^4$ is independently chosen from H, $C_{1-6}$ alkyl, or optionally substituted aryl; and $Ar^1$ is an aromatic moiety. Preferably, each $R^4$ is independently chosen from $C_{3-6}$ alkyl, phenyl and substituted phenyl, and more preferably each $R^4$ is phenyl. A wide variety of aromatic moieties are suitable for use as $Ar^1$, such as those disclosed in U.S. Pat. No. 5,965,679. Exemplary aromatic moieties useful for $Ar^1$ include those having the structure shown in formula (4)

$$-(Ar^2)_x-(Z-Ar^2)_y-$$ (4)

wherein x is an integer chosen from 1, 2 or 3; y is an integer chosen from 0, 1, or 2; each $Ar^2$ is independently chosen from (5)

(6)

each $R^5$ is independently chosen from halogen, $C_{1-6}$ alkyl, halo $C_{1-6}$ alkyl, $C_{1-6}$ alkoxy, halo $C_{1-6}$ alkoxy, phenyl, and phenoxy; c is an integer from 0 to 4; each of d and e is an integer from 0 to 3; each Z is independently chosen from O, S, $NR^6$, $PR^6$, $P(=O)R^6$, $C(=O)$, $CR^7R^8$, and $SiR^7R^8$; $R^6$, $R^7$, and $R^8$ are independently chosen from H, $C_{1-4}$ alkyl, halo $C_{1-4}$ alkyl, and phenyl. It is preferred that x is 1 or 2, and more preferably 1. It is preferred that y is 0 or 1, and more preferably 1. Preferably, each $R^5$ is independently chosen from halogen, $C_{1-4}$ alkyl, halo $C_{1-4}$ alkyl, $C_{1-4}$ alkoxy, halo $C_{1-4}$ alkoxy, and phenyl, and more preferably from fluoro, $C_{1-4}$ alkyl, fluoro $C_{1-4}$ alkyl, $C_{1-4}$ alkoxy, fluoro $C_{1-4}$ alkoxy, and phenyl. It is preferred that c is from 0 to 3, more preferably from 0 to 2, and yet more preferably 0 or 1. It is preferred that each of d and e is independently 0 to 2, and more preferably 0 or 1. In formula (6), it is preferred that d+e=0 to 4, and more preferably 0 to 2. Each Z is preferably independently chosen from O, S, $NR^6$, $C(=O)$, $CR^7R^8$, and $SiR^7R^8$, more preferably from O, S, $C(=O)$, and $CR^7R^8$, and yet more preferably from 0, $C(=O)$, and $CR^7R^8$. It is preferred that each $R^6$, $R^7$, and $R^8$ are independently chosen from H, $C_{1-4}$ alkyl, fluoro $C_{1-4}$ alkyl, and phenyl; and more preferably from H, $C_{1-4}$ alkyl, fluoro $C_{1-2}$ alkyl, and phenyl. Preferably, each $Ar^2$ has the formula (5).

The second monomers useful in preparing the present oligomers have the formula (1)

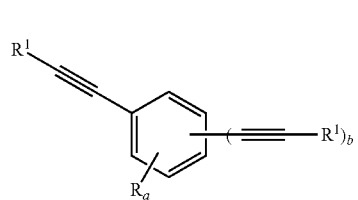

(1)

wherein a is the number of R groups and is an integer from 0 to 4; b is 1 or 2; each R is independently chosen from $C_{1-4}$ alkyl, halo $C_{1-4}$ alkyl, $C_{1-4}$ alkoxy, optionally substituted $C_{7-14}$ aralkyl, and optionally substituted $C_{6-10}$ aryl; and each $R^1$ is independently H or optionally substituted $C_{6-10}$ aryl. Preferably, a=0 to 3, more preferably 0 to 2, and yet more preferably a=0. Preferably, b=1. It is preferred that each R is independently chosen from $C_{1-4}$ alkyl, fluoro $C_{1-4}$ alkyl, $C_{1-4}$ alkoxy, benzyl, phenethyl, phenyl, naphthyl, substituted phenyl and substituted naphthyl, more preferably $C_{1-2}$ alkyl, fluoro $C_{1-4}$ alkyl, $C_{1-2}$ alkoxy, phenyl, and substituted phenyl, and yet more preferably from $C_{1-2}$ alkyl, fluoro $C_{1-4}$ alkyl, $C_{1-2}$ alkoxy, and phenyl. Fluorine is the preferred halogen. Preferably, each $R^1$ is independently H or optionally substituted phenyl, more preferably H or phenyl, and even more preferably H. The second monomer comprises 2 or 3 alkynyl moieties, preferably 2 or 3 alkynyl moieties having a terminal hydrogen or terminal phenyl moiety, more preferably 2 alkynyl moieties having a terminal hydrogen and optionally a third alkynyl moiety having a terminal phenyl moiety, and yet more preferably 2 alkynyl moieties having a terminal hydrogen. Any 2 alkynyl moieties in the second monomer may have an ortho, meta or para relationship to each other, and preferably a meta or para relationship to each other. Preferably, the alkynyl moieties do not have an ortho relationship to each other. A single second monomer of formula (1) may be used to prepare the present oligomers, or two or more second monomers of formula (1) but different from each other may be used. When a single second monomer is used, it is preferred that b=1 or 2, provided that when b=2, two $R^1$ groups =H and the third $R^1$ group=phenyl, and more preferably b=1. In an alternate preferred embodiment, the present oligomers comprise one second monomer of formula (1) wherein b=1, and another second monomer wherein b=2 as polymerized units.

Compounds useful as the second monomers of formula (1) are generally commercially available, or may be prepared by methods known in the art. Preferred second monomers are: 1,3-diethynylbenzene; 1,4-diethynylbenzene; 4,4'-diethynyl-1,1'-biphenyl; 3,5-diethynyl-1,1'-biphenyl; 1,3,5-triethynylbenzene; 1,3-diethynyl-5-(phenylethynyl) benzene; 1,3-bis(phenylethynyl)benzene; 1,4-bis(phenylethynyl)benzene; 1,3,5-tris(phenylethynyl)benzene; 4,4'-bis(phenylethynyl)-1,1'-biphenyl; 4,4'-diethynyldiphenylether; 3,5-diethynylbenzoic acid; and mixtures thereof. More preferably, the second monomers are chosen from: 1,3-diethynylbenzene; 1,4-diethynylbenzene; 4,4'-diethynyl-1,1'-biphenyl; 1,3-bis(phenylethynyl)-benzene; 1,4-bis(phenylethynyl)benzene; 4,4'-bis(phenylethynyl)-1,1'-biphenyl; and mixtures thereof. Even more preferably, the second monomers are chosen from: 1,3-diethynylbenzene; 1,4-diethynylbenzene; 4,4'-diethynyl-1,1'-biphenyl; and mixtures thereof.

The third monomers used in preparing the present oligomers have a single alkyne moiety and function to cap one end, preferably two ends, and more preferably all ends, of the oligomer. It will be appreciated that when only second monomers having 2 alkynyl moieties are used to prepare the present oligomers, the oligomer will be linear and have 2 ends, one of which, and preferably both of which will be capped with the third monomer. When a second monomer having 2 alkynyl moieties having terminal hydrogens and 1 alkynyl moiety having a terminal phenyl group is used to prepare the present oligomers, the reaction conditions can be selected such that the alkynyl moieties having terminal hydrogens react thereby forming a linear oligomer requiring 1 or 2 third monomers as end caps, leaving all (or most) of the alkynyl moieties having the terminal phenyl group unreacted. Further, the third monomers of the present invention possess at least one polar moiety that improves the solubility of the present oligomers in common solvents, such as propylene glycol methyl ether acetate (PGMEA), used in the electronics industry. Preferably, the polar moieties in the resulting oligomer are cleavable under conditions used to cure the present oligomer.

Monomers of formula (2) are useful in preparing the present oligomers

wherein $R^2$ is H, optionally substituted $C_{1-10}$ alkyl, optionally substituted $C_{7-12}$ aralkyl, optionally substituted $C_{6-10}$ aryl, or $R^3$; and $R^3$ is a polar moiety. Suitable polar moieties are any hydrocarbyl moiety having from 1 to 20 carbon atoms and one or more functional groups chosen from —C(O)—, —OH, —NO$_2$, and —NR$^9$R$^{10}$, where $R^9$ and $R^{10}$ are independently chosen from H, $C_{1-10}$ alkyl, $C_{7-16}$ aralkyl, and $C_{6-10}$ aryl, preferably from —C(O)—, —OH, and —NR$^9$R$^{10}$, and more preferably from —C(O)— and —OH. Such —C(O)—, —OH, and —NR$^9$R$^{10}$ functional groups may be part of another functional group, as in carboxylic acids, anhydrides, amides, ketones, esters, and the like. It is preferred that the polar moiety is chosen from carboxyl, $C_{2-12}$ aliphatic carboxylate, hydroxy $C_{1-10}$ alkyl, hydroxy $C_{6-10}$ aryl, $C_{7-20}$ aryl carboxylic acid, $C_{8-20}$ aryl carboxylic acid anhydride, $C_{7-20}$ aryl carboxylates, $C_{7-20}$ aryl amide, $C_{8-20}$ aryl imide, amino $C_{1-10}$ alkyl, and $C_{6-20}$ aryl amine. More preferably, the polar moiety is chosen from carboxyl, $C_{2-12}$ aliphatic carboxylate, hydroxy $C_{1-10}$ alkyl, hydroxy $C_{6-10}$ aryl, $C_{7-16}$ aryl carboxylic acid, and $C_{8-16}$ aryl carboxylic acid anhydride.

Compounds useful as the third monomers of formula (2) are generally commercially available, or may be prepared by methods known in the art. Preferred third monomers are: propiolic acid; acetylene dicarboxylic acid; phenyl propiolic acid; ethynyl benzoic acid; ethynyl phthalic acid; propargyl alcohol; propargylamine; 2-butyn-1,4-diol; 2-methyl-3-butyn-2-ol; 3-butyn-1-ol; 3-butyn-2-ol; 2-butyn-1-ol; 2-butynoic acid; ethynyl phenol; xylityl propiolate; ethynyl phthalic anhydride; ethynyl phthalimide; ethynyl benzamide; 2-butyn-1,4-diol diacetate; 3-butyn-2-one; 1-ethynyl-1-cyclohexanol; 1-ethynylcyclohexylamine; 1-ethynylcyclopentanol; ethynylaniline; N-(ethynylphenyl)acetamide; 2-carbamoyl-5-ethynylbenzoic acid; ethynylnitrobenzene; propiolamide; N-hydroxyl-propiolamide; 2-aminobut-3-ynoic acid; and mixtures thereof. More preferably, the third monomers are: propiolic acid; acetylene dicarboxylic acid; phenyl propiolic acid; ethynyl benzoic acid; ethynyl phthalic acid; propargyl alcohol; 2-butyn-1,4-diol; 2-methyl-3-butyn-2-ol; 3-butyn-1-ol; 3-butyn-2-ol; 2-butyn-1-ol; 2-butynoic acid; ethynyl phenol; xylityl propiolate; ethynyl phthalic anhydride; 2-butyn-1,4-diol diacetate; and mixtures thereof. Such third monomers are generally commercially available from a variety of sources, and may be used as is or further purified before use.

The oligomers of the present invention are prepared by reacting one or more first monomers, one or more second monomers and one or more third monomers in a suitable organic solvent. The mole ratio of the total first monomers to the total second monomers is from 1.2:1 to 1:1.95, preferably from 1.15:1 to 1:1.75, and more preferably from 1.1:1 to 1:1.2. Typically, the total amount of the third monomer is from 0.05 to 0.25 moles, based on 1 mole of the first monomer, preferably from 0.075 to 0.2 moles, and more preferably from 0.09 to 0.125 moles. A preferred range of mole ratios of total first monomer to total second monomer to total third monomer is (1-1.2):(1-1.2):(0.09-0.125). Suitable organic solvents useful to prepare the present oligomers are benzyl esters of $C_{2-6}$ alkanecarboxylic acids, dibenzyl esters of $C_{2-6}$ alkanedicarboxylic acids, tetrahydrofurfuryl esters of $C_{2-6}$ alkanecarboxylic acids, ditetrahydrofurfuryl esters of $C_{2-6}$ alkanedicarboxylic acids, phenethyl esters of $C_{2-6}$ alkanecarboxylic acids, diphenethyl esters of $C_{2-6}$ alkanedicarboxylic acids, and aromatic ethers. Preferred aromatic ethers are diphenyl ether, dibenzyl ether, $C_{1-6}$ alkoxy-substituted benzenes and benzyl $C_{1-6}$ alkyl ethers, and more preferably $C_{1-4}$ alkoxy-substituted benzenes and benzyl $C_{1-4}$ alkyl ethers. Preferred organic solvents are benzyl esters of $C_{2-4}$ alkanecarboxylic acids, dibenzyl esters of $C_{2-4}$ alkanedicarboxylic acids, tetrahydrofurfuryl esters of $C_{2-4}$ alkanecarboxylic acids, ditetrahydrofurfuryl esters of $C_{2-4}$ alkanedicarboxylic acids, phenethyl esters of $C_{2-4}$ alkanecarboxylic acids, diphenethyl esters of $C_{2-4}$ alkanedicarboxylic acids, $C_{1-6}$ alkoxy-substituted benzenes, and benzyl $C_{1-6}$ alkyl ethers, more preferably benzyl esters of $C_{2-6}$ alkanecarboxylic acids, tetrahydrofurfuryl esters of $C_{2-6}$ alkanecarboxylic acids, phenethyl esters of $C_{2-6}$ alkanecarboxylic acids, $C_{1-4}$ alkoxy-substituted benzenes, benzyl $(C_{1-4})$ alkyl ethers, and dibenzyl ether, and yet more preferably benzyl esters of $C_{2-6}$ alkanecarboxylic acids, tetrahydrofurfuryl esters of $C_{2-6}$ alkanecarboxylic acids, $C_{1-4}$ alkoxy-substituted benzenes, and benzyl $C_{1-4}$ alkyl ethers. Exemplary organic solvents include, without limitation, benzyl acetate, benzyl proprionate, tetrahydrofurfuryl acetate, tetrahydrofurfuryl propionate, tetrahydrofurfuryl butyrate, anisole, methylanisole, dimethylanisole, dimethoxybenzene, ethylanisole, ethoxybenzene, benzyl methyl ether, and benzyl ethyl ether, and preferably benzyl acetate, benzyl proprionate, tetrahydrofurfuryl acetate, tetrahydrofurfuryl propionate, tetrahydrofurfuryl butyrate, anisole, methylanisole, dimethylanisole, dimethoxybenzene, ethylanisole, and ethoxybenzene.

The oligomers of the present invention may be prepared by combining the one or more first monomers, the one or more second monomers, the one or more third monomers, and organic solvent, each as described above, in any order in a vessel, and heating the mixture. The first monomer may first be combined with the organic solvent in a vessel, and the second and third monomers then added to the mixture. In one embodiment, the first monomer and organic solvent mixture is heated to the desired reaction temperature before the second monomer is added. The second monomer may be added at one time, but is preferably added over a period of time, such as from 0.25 to 46 hours, and preferably from 1 to 6 hours, to reduce exotherm formation. The first monomer and organic solvent mixture may be heated to the desired reaction temperature before the second and third monomers are added. Alternatively, the first monomer, second monomer, third monomer and solvent are added to a vessel, and then heated to the desired reaction temperature and held at this temperature for a period of time to provide the desired oligomer. The reaction mixture is heated at a temperature of 85 to 160° C. Preferably, the mixture is heated to a temperature of 90 to 160° C., more preferably 95 to 130° C., and yet more preferably 100 to 130° C. The reaction may be carried out under oxygen-containing atmosphere, but an inert atmosphere is preferred. Following the reaction, the resulting oligomer may be isolated from the reaction mixture, diluted with appropriate solvent, or used as is for coating a surface. When a second monomer having 2 alkynyl moieties having terminal hydrogens and 1 alkynyl moiety having a terminal phenyl group is used to prepare the present oligomers, heating the monomer reaction mixture at a temperature of 90 to 130° C. will provide an oligomer where substantially only the alkynyl moieties having terminal hydrogens react with the first monomer to form a linear oligomer having 1 or 2 third monomers as end caps, that is, the alkynyl moieties having the terminal phenyl group remain substantially unreacted (<10%, and preferably <5%, of such groups react).

The oligomers of the present invention typically have a weight average molecular weight ($M_w$) in the range of 4500 to 80000 Daltons (Da), preferably from 5000 to 50000, more preferably from 5000 to 40000, and yet more preferably from 5000 to 30000. The choice of organic solvent can be used to tailor the $M_w$ of the resulting oligomer. For example, when aromatic ether solvents, such as $C_{1-6}$ alkoxy-substituted benzenes, are used, relatively higher $M_w$ oligomers may be obtained as compared to oligomers having a relatively lower $M_w$ when the same reaction is performed using a benzyl ester of a $C_{2-6}$ alkanecarboxylic acid as the organic solvent. The molecular weight of the present oligomers can also be controlled, even in aromatic ether solvents, by adjusting the amount of the second monomer and/or third monomer. For example, to obtain an oligomer having a $M_w$ of ≤35000, >1.05 mole of the second monomer should be used for each 1 mole of the first monomer, that is, the mole ratio of first monomer to second monomer should be ≥1:1.05, such as from 1:1.075 to 1:1.95. As the third monomer has a single alkynyl moiety, it can be used to control the growth of the polymer chain. Increasing the total amount of the third monomer in the reaction will generally provide oligomers having relatively lower weight average molecular weights ($M_w$), while decreasing the total amount of the third monomer will provide oligomers having relatively higher $M_w$.

While not intending to be bound by theory, it is believed that the present polyarylene oligomers are formed through the Diels-Alder reaction of the cyclopentadienone moieties of the first monomer with the alkynyl moieties of the second and third monomer groups upon heating. During such Diels-Alder reaction, a carbonyl-bridged species forms. It will be appreciated by those skilled in the art that such carbonyl-bridged species may be present in the oligomers. Upon further heating, the carbonyl bridging species will be essentially fully converted to an aromatic ring system. Due to the mole ratio of the monomers used, the present oligomers contain one or more arylene rings substituted with at least one polar moiety as illustrated in the following reaction scheme, where A is the first monomer, B is the second monomer, and C is the third monomer. Not wishing to be bound by theory, it is believed that no unreacted cyclopentadienone moieties remain in the present oligomers.

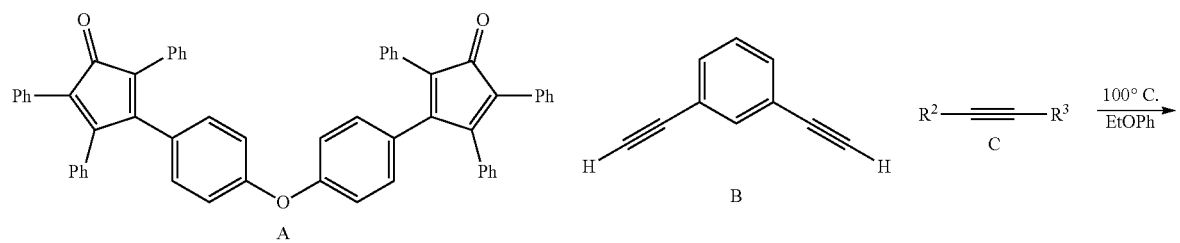

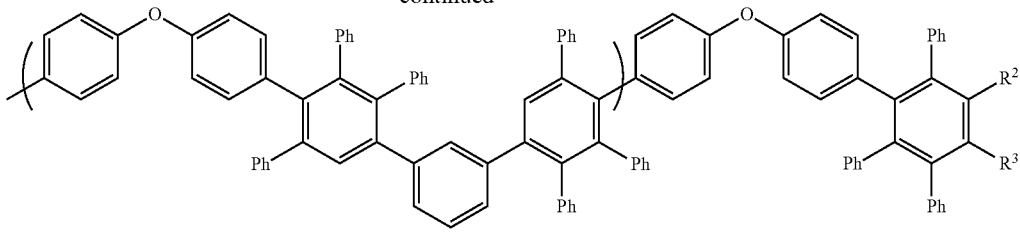

Capped Polyarylene Oligomer

The present oligomer in the organic reaction solvent can be directly cast as a film, applied as a coating or poured into a non-solvent to precipitate the oligomer or polymer. Water, methanol, ethanol and other similar polar liquids such as glycol ethers are typical non-solvents which can be used to precipitate the oligomer. Solid oligomer may be dissolved and processed from a suitable organic solvent described above, or from organic solvents typically used in the electronics industry, such as propylene glycol methyl ether (PGME), PGMEA, methyl 3-methoxypropionate (MMP), ethyl lactate, anisole, N-methyl pyrrolidone, gamma-butyrolactone, ethoxybenzene, benzyl propionate, and mixtures thereof. The one or more polar moieties in the end groups of the oligomers of the invention provide improved solubility as compared to polyarylene oligomers without such polar moieties in the end groups. It will be appreciated by those skilled in the art that the concentration of the oligomer in the organic reaction solvent may be adjusted by removing a portion of the organic solvent, or by adding more of the organic solvent, as may be desired.

In use, the composition comprising the present oligomer and organic solvent may be disposed by any suitable method on any suitable substrate surface. Suitable methods for disposing the composition include, but are not limited to, spin-coating, curtain coating, spray coating, roller coating, dip coating, slot die coating, and vapor deposition, among other methods. In the electronics manufacturing industry, spin-coating is a preferred method to take advantage of existing equipment and processes. In spin-coating, the solids content of the composition may be adjusted, along with the spin speed, to achieve a desired thickness of the composition on the surface it is applied to. Typically, the present compositions are spin-coated at a spin speed of 400 to 4000 rpm. The amount of the composition dispensed on the wafer or substrate depends on the total solids content in the composition, the desired thickness of the resulting coating layer, and other factors well-known to those skilled in the art.

When the present oligomer compositions are used to deposit a coating or film using certain techniques, such as spin-coating, the resulting coating may suffer from certain defects. While not wishing to be bound by theory, it is believed that such defects result from the condensation of moisture on the film surface due to evaporative cooling, and such moisture forces the oligomer out of solution, resulting in a non-uniform coating of oligomer on the surface. To address such defects, a secondary solvent, which is both water-miscible and miscible with the organic solvent used in the composition, may optionally be added to the present oligomer composition. It is believed that such secondary solvent prevents the formation of water droplets during deposition of the oligomer coating on the substrate. Such secondary solvent may be added to the present composition in any suitable amount, such as from 0 to 40 wt %, based upon the total weight of the composition, and preferably from 0 to 30 wt %. Ethyl lactate and gamma-butyrolactone are examples of such a secondary solvent.

In general, the present compositions comprise a polyarylene oligomer of the invention, an organic solvent, and an optional secondary solvent, each as described above, wherein the oligomer is present in an amount of 1 to 35% solids, and preferably from 5 to 15% solids. Such compositions can be used to deposit an oligomer coating on a substrate, where the oligomer coating layer has a thickness of from 50 nm to 500 µm, preferably from 100 nm to 250 µm, and more preferably from 100 nm to 100 µm.

Preferably, after being disposed on a substrate surface, the oligomer composition is heated (soft baked) to remove any organic solvent present. Typical baking temperatures are from 90 to 140° C., although other suitable temperatures may be used. Such baking to remove residual solvent is typically done for approximately 30 sec. to 2 min., although longer or shorter times may suitably be used. Following solvent removal, a layer, film or coating of the oligomer on the substrate surface is obtained. Preferably, the oligomer is next cured, such as by heating to at a temperature of ≥300° C., preferably ≥350° C., and more preferably ≥400° C. Such curing step may take from 2 to 180 min., preferably from 10 to 120 min., and more preferably from 15 to 60 min., although other suitable times may be used. In one embodiment, a belt furnace may be used to cure the oligomer layer on a substrate. Upon curing, it is believed that the present oligomers further polymerize. Such curing step may be performed in an oxygen-containing atmosphere, or in an inert atmosphere, and preferably in an inert atmosphere. It is preferred that the polar moieties are substantially cleaved from the oligomers during the curing step to form a terminal aryl moiety that is substantially free of substitution by polar moieties.

It is known that certain cured polyarylene films do not have good adhesion to substrate surfaces and require the use of an adhesion promoter, such as described in U.S. Pat. No. 5,668,210. Such adhesion promoter is typically applied to the substrate surface before the deposition of the polyarylene oligomer layer, which is subsequently cured to form the crosslinked polyarylene film. If it is desired to use an adhesion promoter, any suitable adhesion promoter for polyarylene films may be used, such as silanes, preferably organosilanes such as trimethoxyvinylsilane, triethoxyvinylsilane, hexamethyldisilazane [$(CH_3)_3$—Si—NH—Si$(CH_3)_3$], or an aminosilane coupler such as gamma-aminopropyltriethoxysilane, or a chelate such as aluminum monoethylacetoacetatedi-isopropylate [((i-$C_3H_7O$)$_2$Al(OCOC$_2H_5$CHCOCH$_3$))]. In some cases, the adhesion promoter is applied from 0.01 to 5 wt % solution, excess solution is removed, and then the polyarylene oligomer is applied. In other cases, for example, a chelate of aluminum monoethylacetoacetatedi-isopropylate, can be incorporated onto a substrate by spreading a toluene solution of the chelate on a substrate and then baking the coated substrate at 350° C. for 30 min in air to form a very thin (for example 5 nm) adhesion promoting layer of aluminum oxide on the surface. Other means for depositing aluminum oxide are likewise suitable. Alternatively, the adhesion promoter, in an amount of, for example, from 0.05 to 5 wt % based on the weight of the monomer, can be blended with the monomers before polymerization, negating the need for formation of an additional layer. Particularly suitable adhesion promoters include those sold under the AP 3000, AP 8000, and AP 9000S designations, available from Dow Electronic Materials (Marlborough, Mass.).

Surprisingly, the presence of 1 or 2 end capping third monomers having polar moieties noticeably improves the solubility of the present oligomers, as compared to the same oligomers without such end capping monomers. Also, the end capping third monomers allow for control of molecular weight since the third monomers contain a single alkyne moiety. The oligomers of the present invention are particularly useful in forming a relatively low dielectric constant insulating cured polyarylene material on an electronic device substrate, such as in integrated circuits, circuit packaging applications, multichip modules, circuit boards, or displays. Cured polyarylene dielectric material produced according to the present invention may be used as is or may be combined with one or more additional dielectric materials, which may be organic or inorganic, to provide the desired insulation layer. Accordingly, the oligomers of the present invention may be used to deposit a coating on a variety of electronic device substrates, including, without limitation, FR-4, silica, silicon nitride, silicon oxynitride, silicon carbide, silicon-germanium, gallium-arsenide, indium-phosphide, aluminum nitride, alumina, and the like.

COMPARATIVE EXAMPLE 1

A conventional polyarylene having end caps free of polar moieties was prepared according to the following reaction scheme and description.

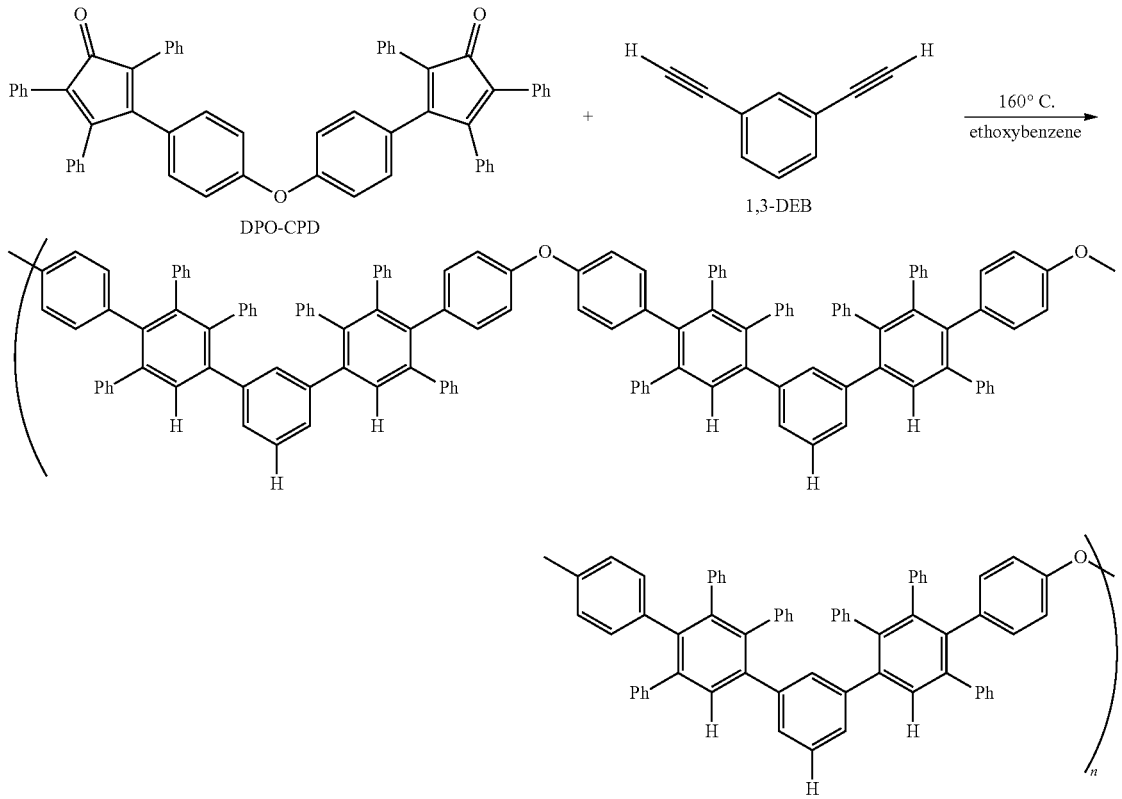

To a multi-neck round-bottomed flask containing a stir bar, diphenylene oxide bis(triphenylcyclopentadienone) (DPO-CPD, 10.95 g, 13.98 mmol) was added via powder funnel, followed by the reaction solvent, ethoxybenzene (33 mL, 40% reagent weight by solvent volume). The reaction was stirred gently at room temperature. The flask was next equipped with a reflux condenser and an internal thermocouple probe attached to a self-regulating thermostat control for a heating mantle, and placed under a nitrogen atmosphere. At this point, 1,3-diethynylbenzene (1,3-DEB, 2.0 mL, 15.38 mmol) was added via syringe. The dark maroon contents of the flask were warmed to an internal temperature of 160° C. over the course of 30 min. and maintained at this temperature for 2 hr. before cooling to room temperature by removal of the heating element. At this point, 33 mL of ethoxybenzene were added to the solution, and the vessel was further cooled to room temperature, providing a clear, pale orange solution. The weight-averaged molecular weight ($M_w$) of the oligomer (Comparative 1) was 25000 Da, as determined by GPC using polystyrene standards.

COMPARATIVE EXAMPLE 2

The procedure of Comparative Example 1 was repeated except that the 1,3-DEB was replaced with 1,4-diethynylbenzene (1,4-DEB). The $M_w$ of the resulting oligomer (Comparative 2) was 22000 Da, as determined by GPC using polystyrene standards.

EXAMPLE 1

To a multi-neck round-bottomed flask containing a stir bar, DPO-CPD (6.21 g, 7.93 mmol), 1,3-DEB (1.00 g, 7.93 mmol) and propiolic acid (0.056 g, 0.79 mmol) were added via powder funnel, followed by the reaction solvent, ethoxybenzene (40 mL). The reaction was stirred gently at room temperature. The flask was next equipped with a reflux condenser and an internal thermocouple probe attached to a self-regulating thermostat control for a heating mantle, and placed under a nitrogen atmosphere. Next, the dark maroon contents of the flask were warmed to an internal temperature of 130° C. and maintained at this temperature for 22 hr. before cooling to 25° C. by removal of the heating element. The resulting red-orange solution was bottled and evaluated as a crude mixture. GPC of the resulting oligomer (Oligomer 1) indicated a $M_w$ of 13900 Da as determined using polystyrene standards.

EXAMPLE 4

The procedure of Example 3 was repeated a number of times using DPO-CPD as the first monomer, either 1,3-DEB or 1,4-DEB as the second monomer, and the third monomers listed in Table 1. The weight-averaged molecular weights of the resulting oligomers are also reported in Table 1.

TABLE 1

| Oligomer No. | Second Monomer | Third Monomer | $M_w$ (Da) |
|---|---|---|---|
| 2 | 1,4-DEB | Propiolic acid | 9500 |
| 3 | 1,3-DEB | Acetylenedicarboxylic acid | 14000 |
| 4 | 1,4-DEB | Acetylenedicarboxylic acid | 30000 |
| 5 | 1,3-DEB | Propargyl alcohol | 19000 |
| 6 | 1,4-DEB | Propargyl alcohol | 13000 |
| 7 | 1,3-DEB | 2-Methyl-3-butyn-2-ol | 12000 |
| 8 | 1,4-DEB | 2-Methyl-3-butyn-2-ol | 18000 |
| 9 | 1,3-DEB | 3-Ethynylphenol | 14000 |
| 10 | 1,4-DEB | 3-Ethynylphenol | 12000 |
| 11 | 1,3-DEB | Xylityl propiolate | 18000 |
| 12 | 1,4-DEB | Xylityl propiolate | 8500 |
| 13 | 1,3-DEB | Ethynyl phthalic anhydride | 14000 |
| 14 | 1,4-DEB | Ethynyl phthalic anhydride | 17000 |

EXAMPLE 5

Oligomers were evaluated for their solubility in various organic solvents. Each oligomer was formulated by adding 5 g of a 30% reaction product solution to a vial along with 5 g of ethoxybenzene (EB) to make a 15% diluted polymer solution. To a 20 mL transparent vial was added 1 g of the polymer solution. Solvent, either MMP, PGMEA or a PGME/PGMEA (30:70 v/v) mixture, was dropwise added to the vial until a persistent precipitate was observed or until the solution became turbid or until a maximum of 10 g of solvent were added. The weight ratio of amount of solvent added in grams to 1 g of polymer solution is reported in Table 2.

TABLE 2

| Oligomer No. | MMP: Solution (w/w) | PGMEA: Solution (w/w) | PGME/PGMEA: Solution (w/w) |
|---|---|---|---|
| Comparative 1 | 4:1 | 1:1 | 0.7:1 |
| Comparative 2 | >10:1 | 3.1:1 | 0.7:1 |
| 1 | >10:1 | 3.3:1 | 0.6:1 |
| 2 | >10:1 | >10:1 | 1:1 |
| 3 | >10:1 | 3:1 | 0.7:1 |
| 4 | >10:1 | >10:1 | 1.1:1 |
| 5 | 7:1 | 2.2:1 | 0.5:1 |
| 6 | >10:1 | 8.5:1 | 0.8:1 |
| 7 | >10:1 | 3.1:1 | 0.6:1 |
| 8 | >10:1 | 3.1:1 | 0.8:1 |
| 9 | >10:1 | 3:1 | 0.6:1 |
| 10 | >10:1 | >10:1 | 1.1:1 |
| 11 | 6.1:1 | 1.8:1 | 0.8:1 |
| 12 | 6.6:1 | 0.5:1 | 0.6:1 |
| 13 | >10:1 | 2.8:1 | 0.5:1 |
| 14 | >10:1 | 3.7:1 | 0.6:1 |

The higher the ratio in Table 2, the more soluble an oligomer is in the solvent. The above data show that oligomers formed using 1,4-DEB as the second monomer are more soluble in organic solvents than the corresponding oligomer formed from 1,3-DEB. These data further show that the oligomers of the invention having a third monomer end cap having one or more polar moieties have improved solubility in organic solvents as compared to the corresponding oligomer that does not have a third monomer end cap.

EXAMPLE 6

The procedure of Example 4 is repeated, except that the second monomers and third monomers shown in Table 3 are used. Where a mixture of certain monomers are used, the ratio provided is the molar ratio.

TABLE 3

| Oligomer No. | Second Monomer | Third Monomer |
|---|---|---|
| 15 | 4,4'-diethynyl-1,1'-biphenyl | Propiolic acid |
| 16 | 4,4'-diethynyl-1,1'-biphenyl | Acetylene dicarboxylic acid |
| 17 | 1,3-diethynyl-5-(phenylethynyl)benzene | Acetylene dicarboxylic acid |
| 18 | 1,3-diethynyl-5-(phenylethynyl)benzene | Propiolic acid |
| 19 | 4,4'-diethynyl-1,1'-biphenyl | Propargyl alcohol |
| 20 | 1,3-bis(phenylethynyl)benzene | Acetylene dicarboxylic acid |
| 21 | 1,3-bis(phenylethynyl)benzene | Propiolic acid |
| 22 | 1,4-bis(phenylethynyl)benzene | Propiolic acid |
| 23 | 1,4-DEB + 1,3-diethynyl-5-(phenylethynyl)benzene (1:1.5) | Acetylene dicarboxylic acid |
| 24 | 1,4-DEB + 1,3,5-tris(phenylethynyl)benzene (1:1.25) | Acetylene dicarboxylic acid |
| 25 | 1,4-DEB | 4-ethynylbenzamide |
| 26 | 1,4-DEB | Propiolamide |
| 27 | 1,4-DEB | 2-Butyn-1,4-diol diacetate |
| 28 | 1,3-DEB | 2-Butynoic acid |
| 29 | 1,3-DEB + 1,3,5-tris(phenylethynyl)benzene (1:1) | 2-Butynoic acid |
| 30 | 1,4-bis(phenylethynyl)benzene | Propargylamine |
| 31 | 1,4-DEB | 3-Ethynylphathalic acid |
| 32 | 1,4-DEB + 1,3,5-tris(phenylethynyl)benzene (1.1:1) | 2-Aminobut-3-ynoic acid |

EXAMPLE 7

An oligomer of the invention having one end cap containing 2 polar moieties was prepared according to the following reaction scheme and description.

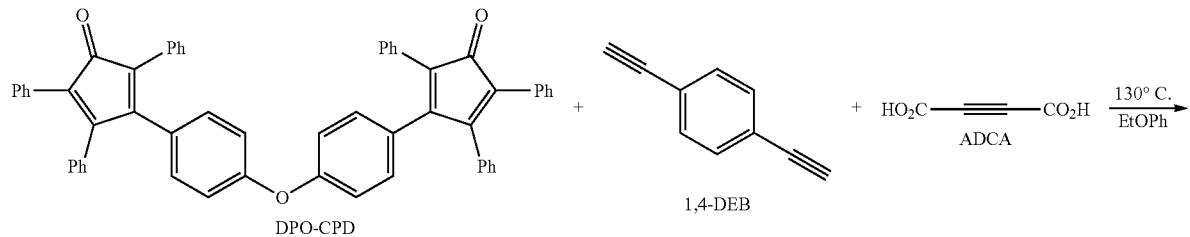

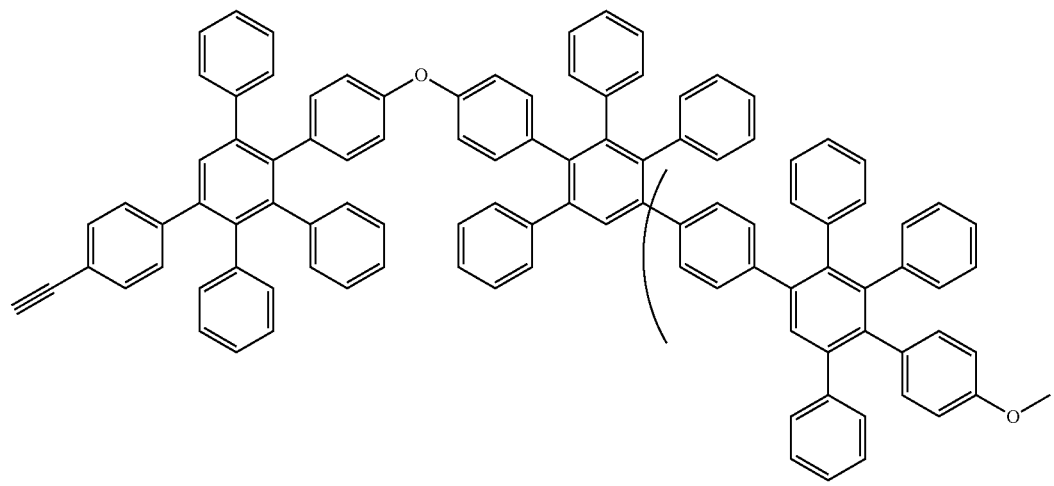

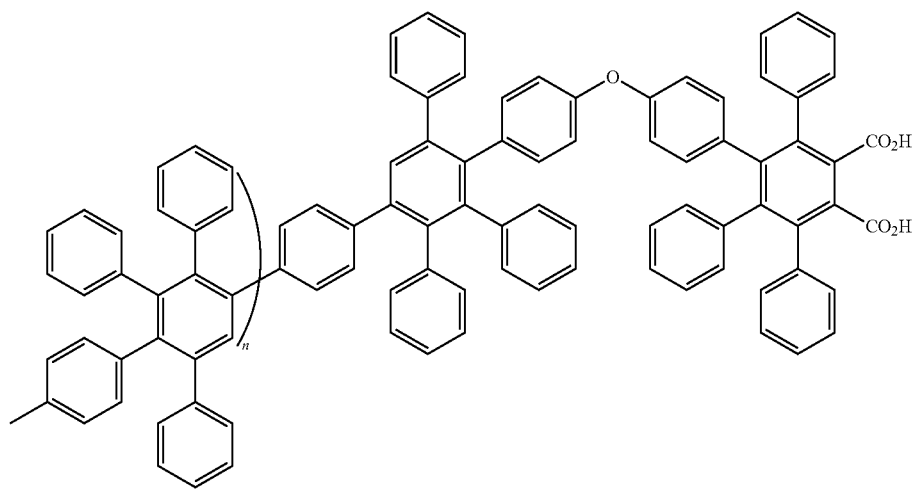

To a multi-neck round-bottomed flask containing a stir bar, DPO-CPD (5.62 g, 7.21 mmol), 1,4-DEB (1.00 g, 7.21 mmol) and acetylenedicarboxylic acid (ADCA, 0.181 g, 1.59 mmol) were added via powder funnel, followed by the reaction solvent, ethoxybenzene (40 mL). The reaction was stirred gently at room temperature. The flask was next equipped with a reflux condenser and an internal thermocouple probe attached to a self-regulating thermostat control for a heating mantle, and placed under a nitrogen atmosphere. Next, the dark maroon contents of the flask were warmed to an internal temperature of 130° C. and maintained at this temperature for 28 hr. before cooling to 25° C. by removal of the heating element. The resulting maroon solution was bottled and evaluated as a crude mixture. GPC of the resulting oligomer material (Oligomer 33) indicated an $M_n$ of 8500, an $M_w$ of 18000, and a polydispersity of 2.1.

EXAMPLE 8

An oligomer of the invention having two end caps containing 2 polar moieties was prepared according to the following reaction scheme and description.

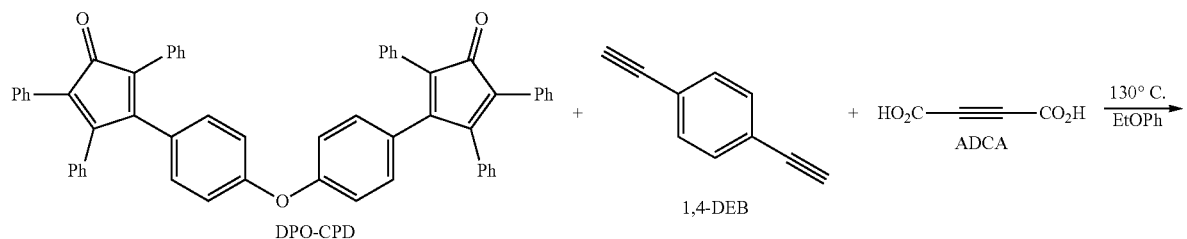

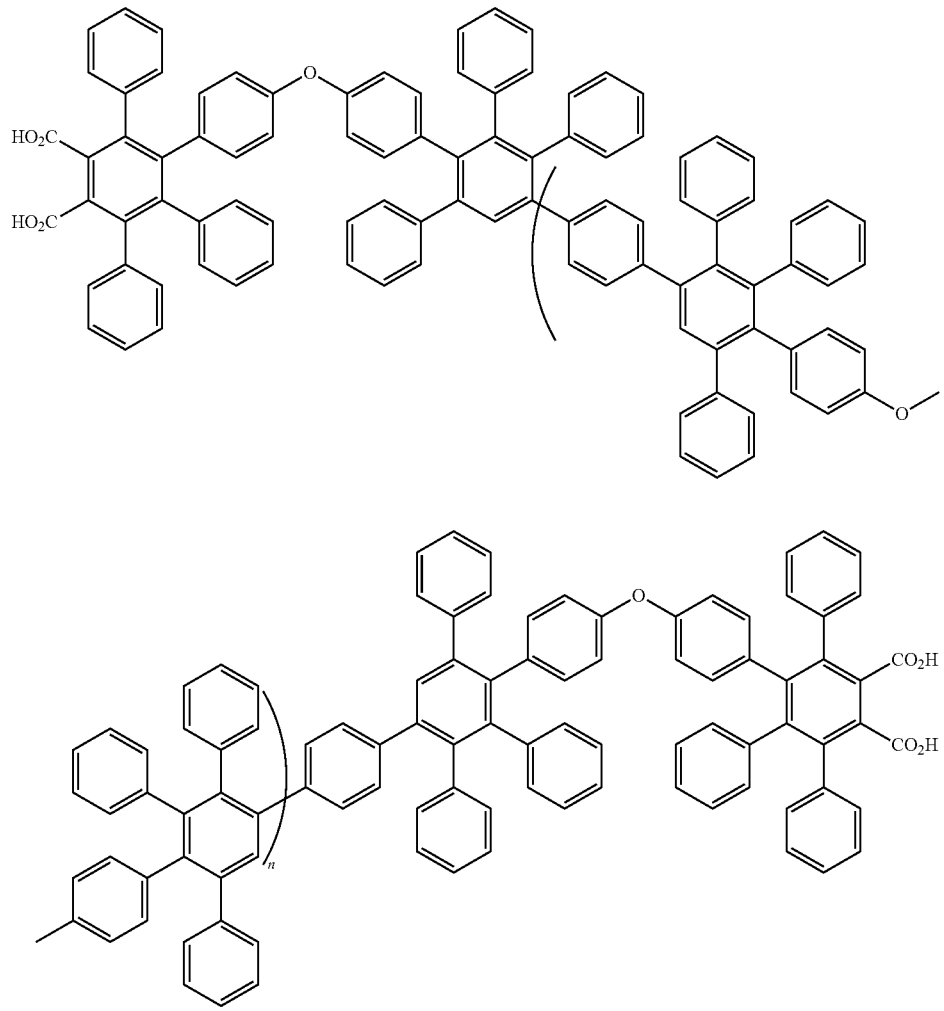

To a multi-neck round-bottomed flask containing a stir bar, DPO-CPD (5.17 g, 6.61 mmol), 1,4-DEB (1.00 g, 7.21 mmol) and ADCA (0.137 g, 1.20 mmol) were added via powder funnel, followed by the reaction solvent, ethoxybenzene (40 mL). The reaction was stirred gently at room temperature. The flask was next equipped with a reflux condenser and an internal thermocouple probe attached to a self-regulating thermostat control for a heating mantle, and placed under a nitrogen atmosphere. Next, the dark maroon contents of the flask were warmed to an internal temperature of 130° C. and maintained at this temperature for 28 hr. before cooling to 25° C. by removal of the heating element. The resulting maroon solution was bottled and evaluated as a crude mixture. GPC of the resulting oligomer material (Oligomer 24) indicated an $M_n$ of 9570, an $M_w$ of 21000, and a polydispersity of 2.2.

EXAMPLE 9

The procedure of Example 7 was repeated numerous times to provide Oligomer 33 having the various $M_w$ values reported in Table 4. The procedure of Example 8 was repeated numerous times to provide Oligomer 34 having the various $M_w$ values reported in Table 4. The procedure of Example 2 was repeated numerous times to provide Comparative 2 having the various $M_w$ values reported in Table 4. The solubility test of Example 5 was repeated using the different $M_w$ samples of Oligomer 33, Oligomer 34, and Comparative 2. The solubility results are also reported in Table 4.

TABLE 4

| Oligomer No. | $M_w$ (Da) | MMP: Solution (w/w) | PGMEA: Solution (w/w) | PGME/PGMEA: Solution (w/w) |
|---|---|---|---|---|
| Comparative 2a | 7000 | >10:1 | >10:1 | 1.2:1 |
| Comparative 2b | 11000 | >10:1 | >10:1 | 0.92:1 |
| Comparative 2c | 23000 | >10:1 | 3.5:1 | 0.59:1 |
| Comparative 2d | 30000 | >10:1 | 2.9:1 | 0.48:1 |
| Comparative 2e | 51000 | >10:1 | 2:1 | 0.39:1 |
| 33a | 9000 | >10:1 | >10:1 | 1.2:1 |
| 33b | 18000 | >10:1 | >10:1 | 0.77:1 |
| 33c | 43000 | >10:1 | 2.7:1 | 0.41:1 |
| 33d | 61000 | >10:1 | 2.1:1 | 0.33:1 |
| 34a | 5000 | >10:1 | >10:1 | 2.2:1 |
| 34b | 9000 | >10:1 | >10:1 | 1.2:1 |
| 34c | 12000 | >10:1 | >10:1 | 1.0:1 |
| 34d | 21000 | >10:1 | 8.6:1 | 0.69:1 |
| 34e | 28000 | >10:1 | 3.5:1 | 0.55:1 |
| 34f | 41000 | >10:1 | 2.9:1 | 0.48:1 |

These data show the general trend that relatively smaller molecular weight versions of an oligomer are more soluble in organic solvents than relative higher molecular weight versions of the same oligomer, irrespective of the end group. These data also show that oligomers comprising end caps having polar moieties have improved solubility in organic solvents as compared to the same oligomers that do not have such end caps containing polar moieties. On average, Oligomers 33 and 34 have PGME/PGMEA solubility that is 14.7% higher than Comparative 2 oligomers of comparable molecular weights.

What is claimed is:

1. An oligomer comprising as polymerized units a first monomer comprising two cyclopentadienone moieties, a second monomer having the formula (1), and a third monomer having the formula (2)

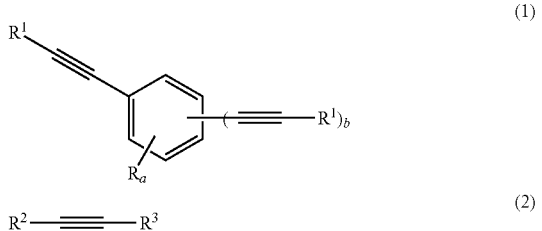

wherein a is the number of R groups and is an integer from 0 to 4; b is 1 or 2; each R is independently chosen from $C_{1-4}$ alkyl, halo $C_{1-4}$ alkyl, $C_{1-4}$ alkoxy, $C_{1-4}$ aralkyl, and optionally substituted $C_{6-10}$ aryl; each $R^1$ is independently H or optionally substituted $C_{6-10}$ aryl; $R^2$ is H, optionally substituted $C_{1-10}$ alkyl, optionally substituted $C_{7-12}$ aralkyl, optionally substituted $C_{6-10}$ aryl, or $R^3$; and $R^3$ is a polar moiety selected from the group consisting of carboxyl, $C_{2-12}$ aliphatic carboxylate, hydroxy $C_{1-10}$ alkyl, $C_{7-20}$ aryl carboxylic acid, $C_{8-20}$ aryl carboxylic acid anhydride, $C_{7-20}$ aryl carboxylates, $C_{7-20}$ aryl amide, and $C_{8-20}$ aryl imide.

2. The oligomer of claim 1 wherein the third monomer is selected from the group consisting of propiolic acid, acetylene dicarboxylic acid, phenyl propiolic acid, ethynyl benzoic acid, ethynyl phthalic acid, propargyl alcohol, 2-methyl-3-butyn-2-ol, xylityl propiolate, ethynyl phthalic anhydride, ethynyl phthalimide, ethynyl benzamide, 2-butyn-1,4-diol diacetate; 3-butyn-2-one; 1-ethynyl-1-cyclohexanol; 1-ethynylcyclohexylamine; 1-ethnylcyclopenta- nol; ethynylaniline; N-(ethynylphenyl)acetamide; 2-carbamoyl-5-ethynylbenzoic acid; ethynyl-nitrobenzene; propioamaide; N-hydroxyl -propiolamide; 2-aminobut-3-ynoic acid, and mixtures thereof.

3. The oligomer of claim 1 wherein the first monomer and the second monomer are present in a mole ratio of from 1:1.001 to 1:1.95.

4. The oligomer of claim 1 wherein the first monomer has the formula

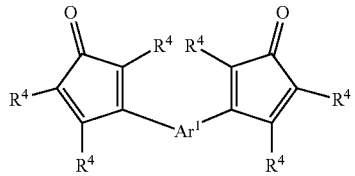

wherein each $R^4$ is independently chosen from H, or optionally substituted phenyl; and $Ar^1$ is an aromatic moiety.

5. The oligomer of claim 1 wherein b=1.

6. The oligomer of claim 5 further comprising another second monomer wherein b=2.

7. A composition comprising the oligomer of claim 1 and an organic solvent.

8. The composition of claim 7 wherein the organic solvent is chosen from propylene glycol methyl ether, propylene glycol methyl ether acetate, methyl 3-methoxypropionate, ethyl lactate, anisole, N-methyl pyrrolidone, gamma-butyrolactone, ethoxybenzene, benzyl propionate, and mixtures thereof.

9. A method of forming a dielectric material layer comprising: disposing a layer of the composition of claim 7 on a substrate surface; removing the organic solvent; and curing the oligomer to form a dielectric material layer.

10. An oligomer comprising as polymerized units a first monomer comprising two cyclopentadienone moieties, a second monomer having the formula (1), and a third monomer having the formula (2)

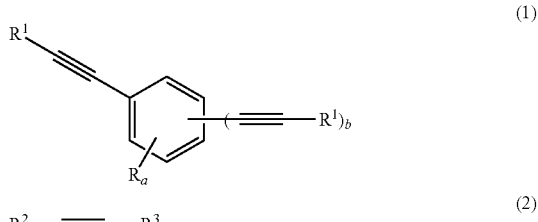

wherein a is the number of R groups and is an integer from 0 to 4; b is 1 or 2; each R is independently chosen from $C_{1-4}$ alkyl, halo $C_{1-4}$ alkyl, $C_{1-4}$ alkoxy, $C_{1-4}$ aralkyl, and optionally substituted $C_{6-10}$ aryl; each $R^1$ is independently H or optionally substituted $C_{6-10}$ aryl; $R^2$ is H, optionally substituted $C_{1-10}$ alkyl, optionally substituted $C_{7-12}$ aralkyl, optionally substituted $C_{6-10}$ aryl, or $R^3$; and $R^3$ is a a hydrocarbyl moiety having from 1 to 20 carbon atoms and one or more functional groups chosen from —C(O)—, —NO$_2$, and —NR$^9$R$^{10}$, where $R^9$ and $R^{10}$ are independently chosen from H, $C_{1-10}$ alkyl, $C_{7-16}$ aralkyl, and $C_{6-10}$ aryl.

* * * * *